United States Patent [19]
Goetting et al.

[11] Patent Number: 6,101,132
[45] Date of Patent: Aug. 8, 2000

[54] BLOCK RAM WITH RESET

[75] Inventors: F. Erich Goetting, Cupertino; Trevor J. Bauer, San Jose, both of Calif.

[73] Assignee: Xilinx, Inc., San Jose, Calif.

[21] Appl. No.: 09/244,328

[22] Filed: Feb. 3, 1999

[51] Int. Cl.[7] .................................................. G11C 7/00
[52] U.S. Cl. ............................ 365/189.02; 365/189.08; 365/230.02
[58] Field of Search ......................... 365/189.02, 230.02, 365/189.05, 189.08

[56] References Cited

U.S. PATENT DOCUMENTS

| | | | |
|---|---|---|---|
| 5,421,000 | 5/1995 | Fortino et al. | 365/189.01 |
| 5,835,406 | 11/1998 | Chevallier et al. | 365/230.02 |
| 5,844,851 | 12/1998 | Pascusi et al. | 365/189.05 |
| 5,923,594 | 7/1999 | Voshell | 365/189.05 |
| 5,923,595 | 7/1999 | Kim | 365/189.05 |

*Primary Examiner*—Son T. Dinh
*Attorney, Agent, or Firm*—Edel M. Young; Scott R. Brown

[57] ABSTRACT

A RAM block includes a circuit for causing the RAM to provide all 0's on the output when a Reset signal is active. The Reset signal does not change the RAM contents but causes all outputs of the block RAM to be 0. This is useful when the RAM block is configured as a state machine. Thus, in an FPGA or other programmable device, an application can start the state machine in a known state with all address bits equal to 0 and can reset the state machine to this startup state. When the reset signal is active, the state machine feeds back the state of 0 to the address inputs of the RAM block that receive state feedback data, regardless of the data actually in those locations.

6 Claims, 3 Drawing Sheets

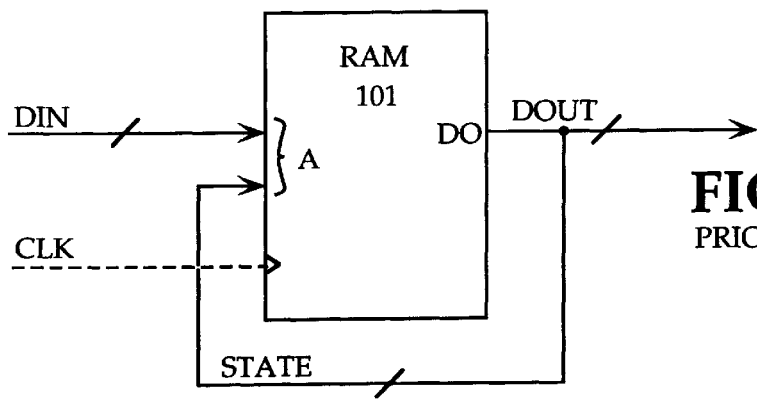
FIG. 1
PRIOR ART
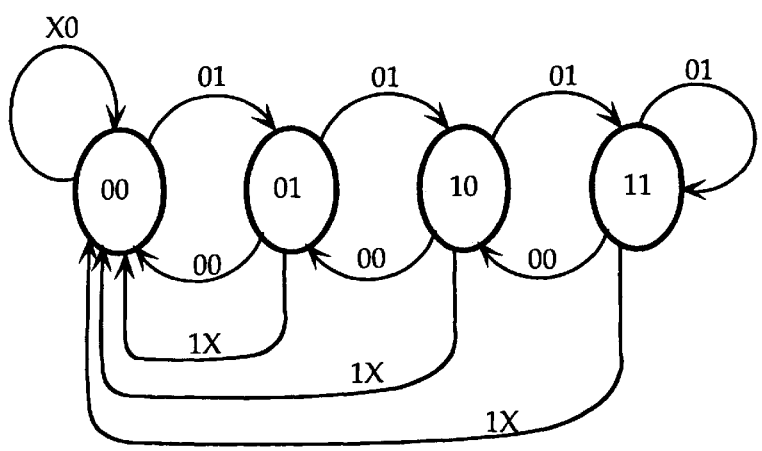
FIG. 2
PRIOR ART
| ADDRESS | | DATA |
|---|---|---|
| | OLD | NEW |
| DIN | STATE | STATE |
| 00 | 00 | 00 |
| 00 | 01 | 00 |
| 00 | 10 | 01 |
| 00 | 11 | 10 |
| 01 | 00 | 01 |
| 01 | 01 | 10 |
| 01 | 10 | 11 |
| 01 | 11 | 11 |
| 10 | 00 | 00 |
| 10 | 01 | 00 |
| 10 | 10 | 00 |
| 10 | 11 | 00 |
| 11 | 00 | 00 |
| 11 | 01 | 00 |
| 11 | 10 | 00 |
| 11 | 11 | 00 |
FIG. 3
PRIOR ART

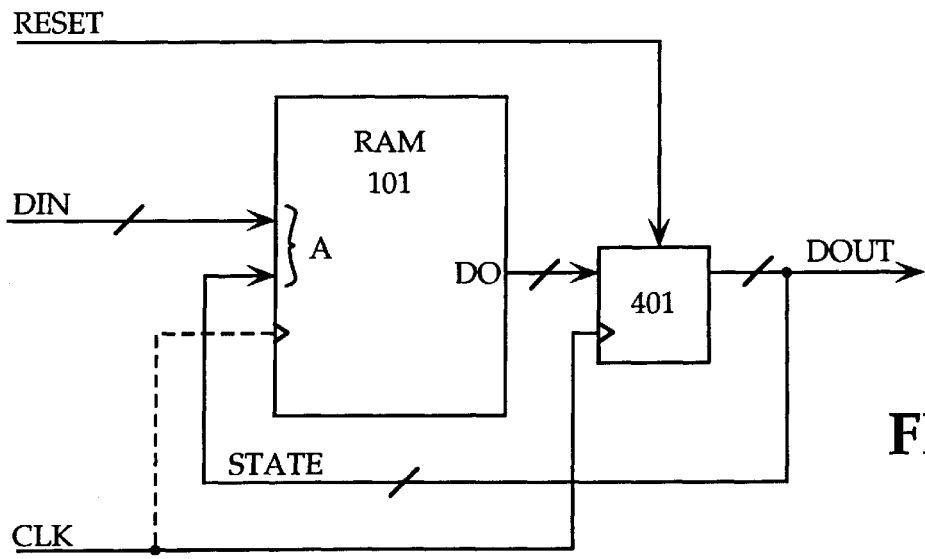
FIG. 4
| ADDRESS | | DATA |
|---|---|---|
| | OLD | NEW |
| DIN | STATE | STATE |
| 0 | 00 | 00 |
| 0 | 01 | 00 |
| 0 | 10 | 01 |
| 0 | 11 | 10 |
| 1 | 00 | 01 |
| 1 | 01 | 10 |
| 1 | 10 | 11 |
| 1 | 11 | 11 |
FIG. 5
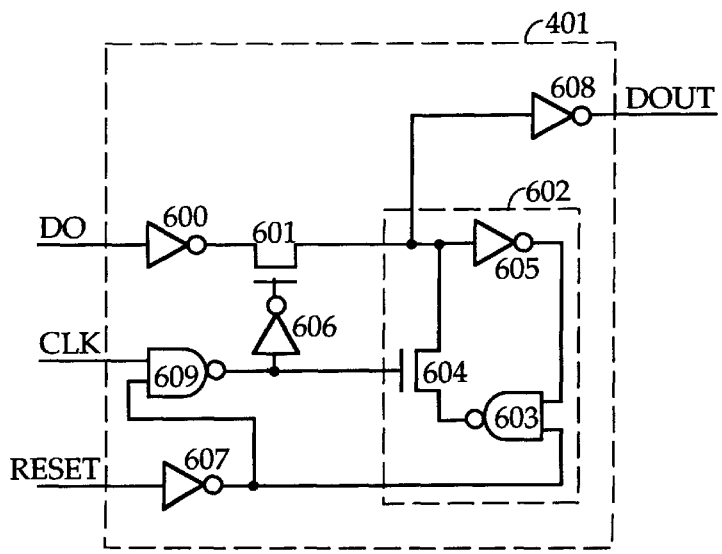
FIG. 6

BLOCK RAM WITH RESET

FIELD OF THE INVENTION

The invention relates to integrated circuits, more particularly to field programmable logic devices having blocks of RAM.

BACKGROUND

FIG. 1 shows a RAM used as a ROM and configured as a finite state machine. Some of the finite state machine (FSM) input wires carry input signals and some carry feedback signals to tell what state the machine is in. Together, these signals form the address of a memory cell in the ROM. Data output from the addressed word of the ROM goes on data-out wires, some of which are state wires that feed back to the address input ports, and some of which form the FSM output. In a state machine some of the address bits are controlled by output data fed back from the block RAM and other address bits are provided externally.

FIG. 2 shows an example state machine that can be implemented by the ROM structure of FIG. 1. This state machine moves up one state or remains in the highest state in response to a data value of 01. It moves down one state or remains in the lowest state in response to a data value of 00. And it resets to state 00 in response to a data value of 10 or 11. In other words, the first bit serves as a reset signal. FIG. 3 shows the addresses and data values to be stored in the ROM structure of FIG. 1 for implementing this state machine. Sixteen memory locations are required in order to get the fast reset to state 00 required by the state machine of FIG. 2.

It would be preferable to use fewer memory locations to implement such a simple state machine.

INVENTION

According to the invention, a RAM includes a circuit for causing the RAM to provide all 0's on the output when a Reset signal is active. The Reset signal does not change the RAM contents but causes all outputs of the RAM to be 0 (or 1 in another embodiment). This is useful, for one example, when the RAM is configured as a state machine. Thus, in an FPGA or other programmable device, an application can start the state machine in a known state with all address bits equal to 0 and can reset the state machine to this startup state. When the reset signal is active, the state machine feeds back the state of 0 to the address inputs of the RAM that receive state feedback data, regardless of the data actually in those locations. The circuit of the invention is also useful in any case where the user wishes to mask the RAM output data without using additional gating circuitry that may hurt performance.

BRIEF DESCRIPTION OF THE DRAWINGS

FIG. 1 shows a prior art use of a RAM as a state machine ROM.

FIG. 2 shows an example state machine that can be implemented by the ROM of FIG. 1.

FIG. 3 shows address and data values stored in the RAM of FIG. 1 to implement the state machine of FIG. 2.

FIG. 4 shows a RAM with reset according to the present invention being used as a state machine ROM.

FIG. 5 shows address and data values stored in the RAM with reset of FIG. 4 to implement the state machine of FIG. 2.

FIG. 6 shows one implementation of the reset circuit 401 of FIG. 4.

DETAILED DESCRIPTION OF THE DRAWINGS

Figure 7:
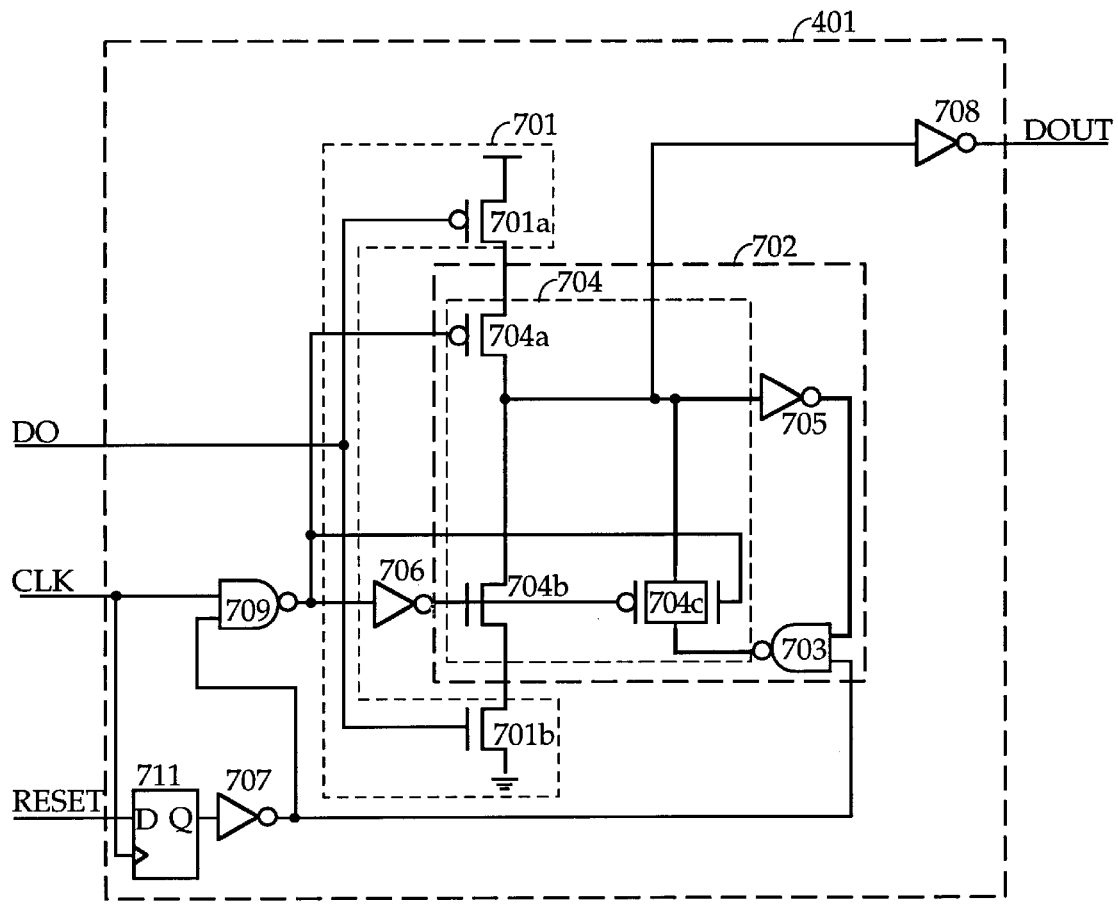
FIG. 7 shows another implementation of the reset circuit 401 of FIG. 4.

FIG. 4 shows a RAM with reset according to the present invention. The data output values DO from RAM 101 are provided as input signals to a reset circuit 401. When RESET is high, a rising edge on CLK causes all DOUT values to be 0 regardless of the values DO.

FIG. 5 shows the truth table that can be stored in RAM 101 in the presence of reset logic 401 to implement the state machine of FIG. 2. One of the DIN bits of FIG. 3 is replaced by the RESET signal of FIG. 4. Note that this simple state machine now requires only 8 memory words rather than the 16 of FIG. 3.

FIG. 6 shows one implementation of the reset circuit 401 of FIG. 4. Of course in a RAM having eight data bits, eight circuits such as shown in FIG. 6 are provided. In FIG. 6, if RESET is low, NAND gate 609 responds to CLK. In response to a rising edge of CLK, transistor 601 turns on, and transistor 604 turns off, which passes the previous value DO through inverters 600 and 608 to DOUT. But if RESET is high, NAND gate 609 provides a constant high output signal, transistor 601 turns OFF, and the value on DOUT is logic 0, not the value DO. Note that in FIG. 6 the reset action is asynchronous since the reset signal overrides the clock signal.

FIG. 7 shows another embodiment of the circuit 401 of FIG. 4. In FIG. 7, asynchronous signal RESET is stored by flip flop 711, and synchronously provided through inverter 707 to NAND gate 709 as well as to NAND gate 703 in latch 702. When RESET is low, a rising edge of CLK causes flip flop 711 and inverter 707 to place a high signal on the input of NAND gate 709, so that after a brief delay NAND gate 709 provides a low output signal, turning off transmission gate 704c and turning on transistors 704a and 704b so that the inverse of DO is provided by one of transistors 701a and 701b to latch 702 comprising inverter 705 and NAND gate 703. A falling edge of CLK turns on transmission gate 704c and turns off transistors 704a and 704b, thus storing the inverse of DO on latch 702. Thus the value DO present at the last high value of CLK is provided by inverter 708 at DOUT.

Figure 8A:
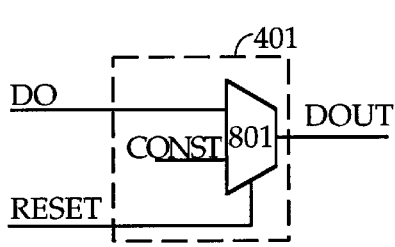
FIGS. 8a, 8b, and 8c show asynchronous implementations of the reset circuit 401 of FIG. 4.
Figure 8B:
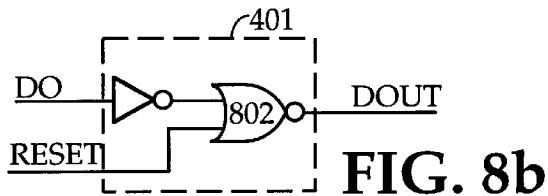
Figure 8C:
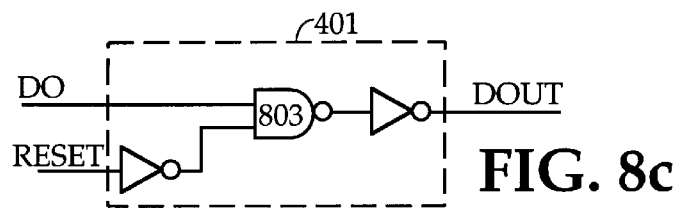

FIGS. 8a–8c show three asynchronous circuits that can be used for reset circuit 401 of FIG. 4.

FIG. 8a shows a multiplexer implementation in which the reset signal RESET is applied to the control terminal of multiplexer 801. The data input value DO is applied to one input terminal of multiplexer 801 and a reset value CONST is applied to the other input terminal. When RESET is low, the DO input value is applied to DOUT. When RESET is high, the reset value CONST, which may be 0 or 1 depending on the desired polarity of the reset signal, is applied to DOUT. There is no clock signal, and the reset operation is asynchronous.

FIG. 8b shows a NOR gate implementation in which input signal DO is inverted and applied to NOR gate 802. RESET is also applied to NOR gate 802. Thus when RESET is low, DO is inverted twice to form the DOUT signal. When RESET is high, DOUT is low regardless of DO.

Similarly, FIG. 8c shows a NAND gate implementation. When RESET is low, NAND gate 803 inverts input signal DO, and the output signal of NAND gate 803 is inverted again to form DOUT. When RESET is high, NAND gate 803 outputs a high signal regardless of DO, and this high signal is again inverted to give a low DOUT signal.

The embodiments described above are illustrative only and not limiting. Other embodiments within the scope of the present invention will be apparent to those skilled in the art. The present invention is set forth in the appended claims.

What is claimed is:

1. A RAM with reset comprising:

a block of memory cells having:

a plurality of address lines for addressing one word of the memory cells;

a plurality of data out lines;

a reset circuit receiving signals on each of the data out lines and receiving a reset signal, said reset circuit providing a plurality of data output signals equal to the signals on each of the data out lines when the reset signal is not active and said reset circuit providing a plurality of data output signals equal to a reset value when the reset signal is active.

2. A RAM with reset as in claim 1 where the reset circuit is a multiplexer.

3. A RAM with reset as in claim 1 where the reset circuit is a combinatorial gate.

4. A RAM with reset as in claim 1 where the reset circuit is a resettable latch.

5. A RAM with reset as in claim 1 where the RAM with reset is implemented as an element within a field programmable gate array.

6. In a circuit having a RAM with a plurality of address lines and a reset circuit providing a plurality of data output signals equal to output signals of an addressed memory word when the reset signal is not active and said reset circuit providing a plurality of data output signals equal to a reset value when the reset signal is active, a method for using the RAM with reset circuit as a state machine comprising the steps of:

connecting a reset line to the reset circuit;

connecting state machine input signals to some of the plurality of address lines; and connecting some of the plurality of data output signals to the remainder of the plurality of address lines; whereby when a reset signal is active the data output signals provide a reset value to the remainder of the plurality of address lines and when the reset signal is not active the data output signals provide data in addressed memory cells to the remainder of the plurality of address lines.

* * * * *